(12) United States Patent
Mayer et al.

(10) Patent No.: US 11,569,811 B2
(45) Date of Patent: Jan. 31, 2023

(54) SMART ELECTRONIC SWITCH

(71) Applicant: Infineon Technologies AG, Neubiberg (DE)

(72) Inventors: Alexander Mayer, Treffen (AT); Marco Faricelli, Villach (AT); Robert Illing, Finkenstein (AT)

(73) Assignee: Infineon Technologies AG, Neubiberg (DE)

( * ) Notice: Subject to any disclaimer, the term of this patent is extended or adjusted under 35 U.S.C. 154(b) by 218 days.

(21) Appl. No.: 17/024,059

(22) Filed: Sep. 17, 2020

(65) Prior Publication Data

US 2021/0083659 A1 Mar. 18, 2021

(30) Foreign Application Priority Data

Sep. 18, 2019 (DE) .......................... 102019125122.2

(51) Int. Cl.
*H03K 17/082* (2006.01)
*H03K 17/14* (2006.01)
*G01K 3/08* (2006.01)
*G01R 19/165* (2006.01)
*G01K 3/00* (2006.01)
*G01R 19/25* (2006.01)

(52) U.S. Cl.
CPC ......... *H03K 17/0822* (2013.01); *G01K 3/005* (2013.01); *G01K 3/08* (2013.01); *G01R 19/16571* (2013.01); *G01R 19/2513* (2013.01); *H03K 17/145* (2013.01)

(58) Field of Classification Search
None
See application file for complete search history.

(56) References Cited

U.S. PATENT DOCUMENTS

| | | | |
|---|---|---|---|
| 2017/0294772 A1 | 10/2017 | Illing et al. | |
| 2017/0294773 A1 | 10/2017 | Illing et al. | |
| 2017/0294774 A1* | 10/2017 | Illing | H02H 3/087 |
| 2018/0287365 A1 | 10/2018 | Djelassi-Tscheck et al. | |

FOREIGN PATENT DOCUMENTS

| | | |
|---|---|---|
| DE | 102017107521 A1 | 10/2017 |
| DE | 102017107522 A1 | 11/2017 |
| DE | 102017106896 A1 | 10/2018 |

* cited by examiner

*Primary Examiner* — Daniel C Puentes
(74) *Attorney, Agent, or Firm* — Slater Matsil, LLP (57) ABSTRACT

An electronic fuse circuit includes an electronic switch with a load current path coupled between an output node and a supply node and that connects or disconnects the output node and the supply node in accordance with a drive signal. The circuit includes a control circuit to generate the drive signal based on an input signal. A monitoring circuit is included in the control circuit to receive a current sense signal representing the load current passing through the load current path and to determine a first protection signal based on the current sense signal and a wire parameter. The first protection signal is indicative of whether to disconnect the output node from supply node. The control circuit changes from normal mode to idle mode when the load current is below a given current threshold and another criterion is fulfilled.

13 Claims, 7 Drawing Sheets

SMART ELECTRONIC SWITCH

CROSS-REFERENCE TO RELATED APPLICATIONS

This application claims the benefit of German Application No. 102019125122.2, filed on Sep. 18, 2019, which application is hereby incorporated herein by reference.

TECHNICAL FIELD

The present disclosure relates to the field of smart semiconductor switches.

BACKGROUND

Almost every electric installation (e.g., in an automobile, in a house, electric subsystems of larger installations) include one of more fuses to provide an over-current protection. Standard fuses include piece of wire, which provides a low-ohmic current path in case the current passing through the fuse is below a nominal current. However, the piece of wire is designed to heat up and melt or vaporize when the current passing through the fuse exceeds the nominal current for a specific time. Once triggered a fuse has to be replaced by a new one.

Fuses are increasingly replaced by circuit breakers. A circuit breaker is an automatically operated electrical switch designed to protect an electrical circuit from damage caused by overcurrent or overload or short-circuit. Circuit breakers may include electro-mechanical relays, which are triggered to disconnect the protected circuit from the supply when an over-current (i.e., a current exceeding the nominal current) is detected. In many applications (e.g., in the on-board power supply of an automobile), circuit breakers may be implemented using an electronic switch (e.g., a MOS transistor, an IGBT or the like) to disconnect the protected circuit from the supply in case of an over-current. Such electronic circuit breakers may also be referred to as electronic fuses (e-fuses or smart fuses). Besides its function as a circuit breaker, an electronic fuse may also be used to regularly switch a load on and off. Usually, the switching state (on/off) of electronic switches such as MOS transistors is controlled using so-called driver circuits or simply drivers (gate drivers in case of MOS transistors).

However, at least in some electronic circuit breakers (electronic fuses or e-fuses) common driver circuits may be inadequate with regard to fault tolerance and functional safety, which may be an issue particularly in automotive applications, in which standards concerning functional safety must be complied with (e.g., ISO 26262). In fact, an electronic fuse needs more than just replacing a classical fuse by an electronic switch. A robust implementation of an electronic fuse entails various challenges. Further, current consumption of the e-fuse itself may be an issue.

SUMMARY

A circuit for use as an electronic fuse is described herein. In accordance with one example, the circuit includes an electronic switch that has a load current path coupled between an output node and a supply node and that is configured to connect or disconnect the output node and the supply node in accordance with a drive signal. The circuit further includes a control circuit configured to generate the drive signal based on an input signal. A monitoring circuit is included in the control circuit and configured to receive a current sense signal representing the load current passing through the load current path and to determine a first protection signal based on the current sense signal and at least one wire parameter, which characterizes a wire operably connected to the output node. The mentioned first protection signal is indicative of whether to disconnect the output node from supply node. The control circuit is configured to operate in a normal mode and at least in an idle mode, and further to change from normal mode to idle mode, when the load current is below a given current threshold and at least one further criterion is fulfilled. In idle mode, the monitoring circuit is inactive.

Furthermore a method for operating an electronic fuse circuit is described herein. In accordance with one embodiment the method comprises establishing a load current path between an output node and a supply node by activating an electronic switch in accordance with a drive signal, which is generated by a control circuit. The control circuit is configured to operate in a normal mode and at least in an idle mode. The method further includes determining—by a monitoring circuit included in the control circuit and when the control circuit operates in normal mode—a first protection signal based on a current sense signal, which represents a load current passing through the load current path, and at least one wire parameter that characterizes a wire operably connected to the output node. Thereby, the first protection signal is indicative of whether to disconnect the output node from supply node. Furthermore, the method comprises changing from normal mode to idle mode, when at least the following idle mode conditions are fulfilled: the load current is below a given current threshold and the electronic switch is switched on.

BRIEF DESCRIPTION OF THE DRAWINGS

The invention can be better understood with reference to the following drawings and descriptions. The components in the figures are not necessarily to scale; instead emphasis is placed upon illustrating the principles of the invention. Moreover, in the figures, like reference numerals designate corresponding parts. In the drawings.

DETAILED DESCRIPTION OF ILLUSTRATIVE EMBODIMENTS

In the following detailed description, reference is made to the accompanying drawings. The drawings form a part of the description and, for the purpose of illustration, show examples of how the invention may be used and implemented. It is to be understood that the features of the various embodiments described herein may be combined with each other, unless specifically noted otherwise.

Figure 1:
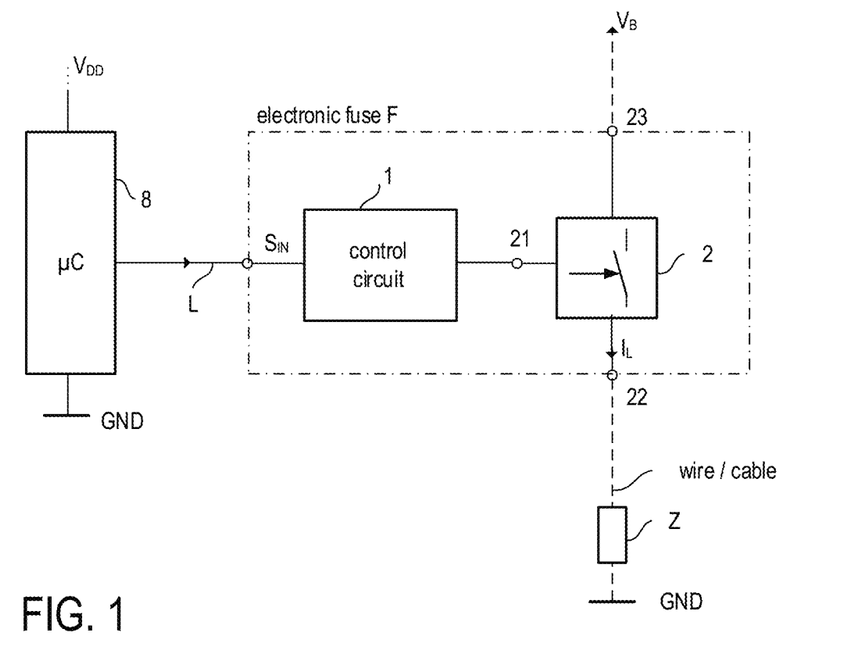
FIG. 1 schematically illustrates one example of an electronic fuse circuit including an electronic switch and a control circuit configured to drive the electronic switch and an exemplary application of the electronic fuse circuit.

FIG. 1 illustrates one example of an electronic circuit, which may be operated as an electronic fuse. Therefore the electronic circuit is further referred to as electronic fuse circuit F. In accordance with the present example, an electronic fuse circuit includes an electronic switch 2 with a control node 21 and a load current path between a first load node 22 and a second load node 23. The electronic circuit further includes a control circuit 1 coupled to the control node 21 of the electronic switch 2 and configured to drive the electronic switch 2. The electronic fuse circuit F with electronic switch 2 and control circuit 1 may be monolithically integrated on one semiconductor die (chip) or may be integrated in two semiconductor dies that are arranged in one integrated circuit package. The electronic fuse circuit F is configured to drive a load Z (the wires connecting the load are illustrated in dashed lines in FIG. 1) that can be connected in series with the load current path of the electronic switch 2. Thereby, the series circuit of the load current path of the electronic switch 2 and load Z may be connected between supply nodes, at which a positive supply potential and a negative supply potential or ground potential GND (zero volts) may be provided. In the following, a voltage between the two supply nodes is referred to as supply voltage $V_B$. The load current $i_L$ passing through the load Z may be switched on and off in accordance with an input signal $S_{IN}$ supplied to the control circuit 1, for example, by a micro controller 8. However, dependent on the application the input signal $S_{IN}$ may be generated by any other circuitry instead of a micro controller.

In an exemplary application, the electronic fuse circuit F may be used to drive a load Z in an automobile. In this case, a power source that supplies the supply voltage $V_B$ is an automobile battery. Generally, "to drive a load" may include switching on or off the load current passing through the load by switching on or off the electronic switch 2. The load may be an arbitrary load used in an automobile. Examples of the load Z include, inter alia, different types of lamps, different types of motors, relays, a heating system, or the like. In the example illustrated in FIG. 1, the electronic switch 2 and the load Z are connected in a high-side configuration. That is, the load Z is connected between the electronic switch 2 and the ground node GND. This, however, is only an example. The electronic switch 2 and the load Z may also be connected in a low-side configuration or in any other configuration as well. For example, in a low-side configuration the electronic switch is connected between the load Z and the ground node GND.

According to the example of FIG. 1, the load Z may be connected to the electronic switch 2 via an electrically conductive wire (e.g., included in a cable). Dependent on where the electronic circuit and the respective load Z are located within the electric installation of an automobile, the wire may have a considerable length of several 10 cm or even more (e.g., up to 10 m). A modern automobile includes a plurality of electric loads, so that a plurality of wires are required to connect the individual loads to their respective electronic switches. In order to save costs and resources, it may be desirable to dimension the individual wires such that, on a long term, they withstand a nominal current of the connected load. If, however, the current rises above the nominal current, the wire may be damaged or even destroyed due to overheating. According to one exemplary embodiment, the control circuit 1 may therefore have a current monitor function in order to monitor the load current $i_L$ passing through the electronic switch 2 (and the load Z). The current monitoring allows to switch off the electronic switch 2 in order to protect the wire (and the load Z) when an overload scenario is detected. An "overload scenario" is a scenario that may result in the wire or the load being damaged or destroyed if the electronic switch 2 would not be switched off (within a specific time) to disconnect the wire (and the load Z) from the power source, which provides the supply voltage $V_B$ (e.g., the automobile battery). This mechanism is explained in further detail herein below. As the electronic fuse circuit F is configured to switch on and off the load Z and to protect the wire, it is also referred to as switching and protection circuit in the following.

According to the example of FIG. 1, the electronic switch 2 is schematically drawn as a circuit block that includes a switch. In the following, the term "electronic switch" includes any type of electronic switch or electronic circuitry that has a control node 21 and a load current path between the first load node 22 and the second load node 23 and that is configured to be switched on and off dependent on a drive signal received at the control node 21. "Switched on" means that the electronic switch 2 operates in an on-state, in which the electronic switch 2 is capable of conducting a current between the first load node 22 and the second load node 23. "Switched off" means that the electronic switch 2 is operated in an off-state, in which the electronic switch 2 is capable of preventing a current flow between the first load node 22 and the second load node 23. According to one example, the electronic switch 2 includes at least one transistor. The at least one transistor may be, for example, a MOSFET (Metal Oxide Semiconductor Field-Effect Transistor), an IGBT (Insulated Gate Bipolar Transistor), a JFET (Junction Field-Effect Transistor), a BJT (Bipolar Junction Transistor), or a HEMT (High Electron Mobility Transistor).

In the following, examples of the control circuit 1 and its function are explained with reference to drawings. In particular, the function of the control circuit 1 is explained with reference to functional blocks depicted in the drawings. It should be noted that these functional blocks represent the function of the control circuit 1 rather than its specific implementation. These functional blocks may be dedicated circuit blocks configured to perform the respective function explained below. However, may also be possible that the functions of the individual functional blocks are performed by a programmable circuit (processor), which is configured to execute software/firmware stored in a memory.

Figure 2:
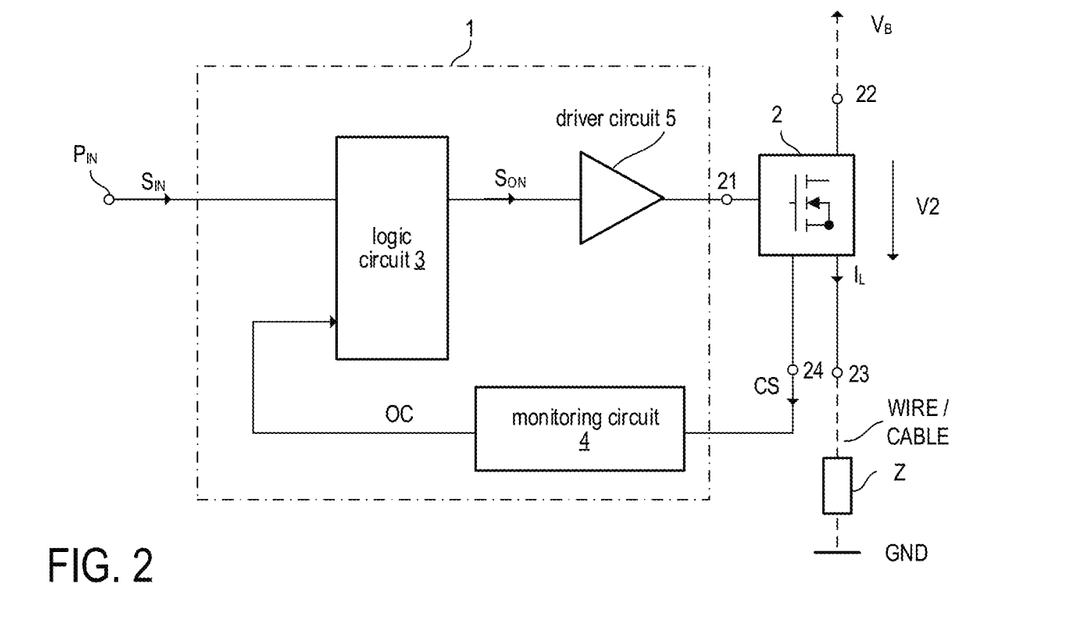
FIG. 2 illustrates one example of the control circuit of FIG. 1 in more detail.

FIG. 2 illustrates one exemplary implementation of the control circuit 1. In this example, the control circuit 1 includes a monitoring circuit 4 that is configured to generate a first protection signal OC based on a current-time-characteristic of the load current $i_L$. The expression "to generate the first protection signal OC based on the current-time-characteristic of the load current $i_L$" may include that the monitoring circuit 4 processes an instantaneous current amplitude of the load current $i_L$ as well as previous current amplitudes to generate the first protection signal OC. That is, the monitoring circuit 4 evaluates the load current $i_L$ over a certain time period in order to generate the first protection signal OC. To be able to evaluate the load current $i_L$ the monitoring circuit 4 receives a current sense signal CS and generates the first protection signal OC based on the current sense signal CS. The current sense signal CS represents the load current $i_L$ and, according to one example, may be proportional to the load current $i_L$. In the example of FIG. 2, the current sense signal CS is available at a sense output 24 of the electronic switch 2. In this case, a current measurement circuit configured to measure the load current $i_L$ and provide the current sense signal CS may be integrated in the electronic switch 2. However, this is only an example. A current measurement circuit separate from the electronic switch 2 may be used as well. Various current sense circuits (e.g., shunt resistors, Sense-FET circuits, etc.) are known and are thus not further explained herein in more detail. One specific example of a current sense circuit is included in FIG. 8 and will be discussed further below.

The control circuit 1 illustrated in FIG. 2 is configured to drive the electronic switch 2 based on the protection signal OC and an input signal $S_{IN}$ received at a first input node (e.g., input pin) $P_{IN}$ of the electronic fuse circuit F. The protection signal OC as well as the input signal $S_{IN}$ are supplied to a logic circuit 3, which generates a drive signal $S_{ON}$ based on the protection signal OC and the input signal $S_{IN}$. The drive signal $S_{ON}$ is directly or indirectly (e.g., via diver circuit 5) supplied to the control node 21 of the electronic switch 2 in order to switch the electronic switch 2 on or off. According to one example, the drive signal $S_{ON}$ may be a logic signal that has an on-level indicating that it is desired to switch the electronic switch 2 on or an off-level indicating that it is desired to switch the electronic switch 2 off. The driver circuit 5 (or simply driver) is configured to drive the electronic switch 2 based on the respective signal level of the drive signal $S_{ON}$. The electronic switch 2, for example, includes a transistor, such as a MOSFET (as schematically illustrated in FIG. 2). A MOSFET is a voltage controlled semiconductor device that switches on or off dependent on a drive voltage applied between a gate node and a source node. In this example, the driver 5 is configured to generate the drive voltage (gate voltage $V_G$) based on the drive signal $S_{ON}$ in order to switch on or off the MOSFET in accordance with the drive signal. When using MOSFETs, the driver 5 is also referred to as gate driver.

Figure 3:
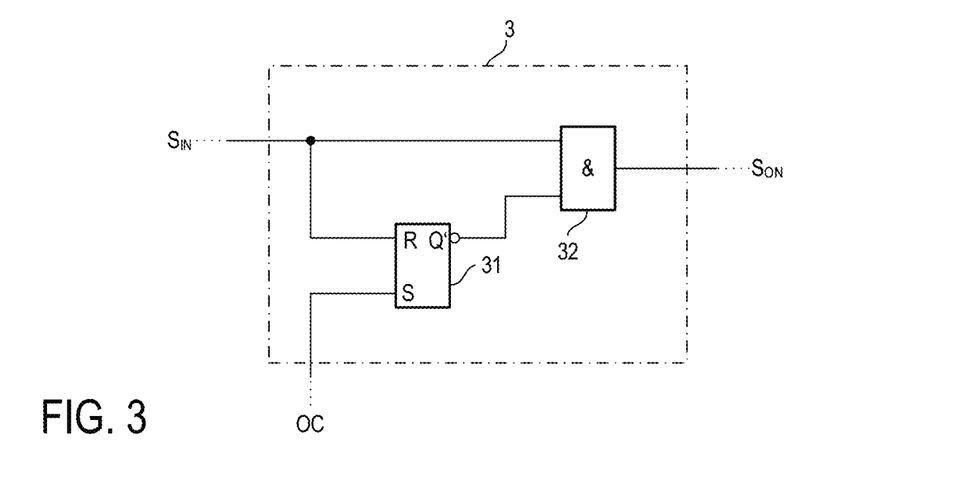
FIG. 3 illustrates one example of a logic circuit used in the control circuit of FIG. 2.

The circuit of FIG. 3 illustrates one exemplary implementation of (a part of) the logic circuit 3. In the present example, the logic circuit 3 includes a SR latch 31 (flip-flop) and an AND gate 32. A reset input R of the SR latch 31 as well as a first input of the AND gate 32 are configured to receive the input signal SIN. The set input S of the SR latch 31 is configured to receive the first protection signal OC. The inverting output Q' of the SR latch 31 is connected with a second input of the AND gate 32. The drive signal $S_{ON}$ is provided at the output of the AND gate 32.

Figure 4:
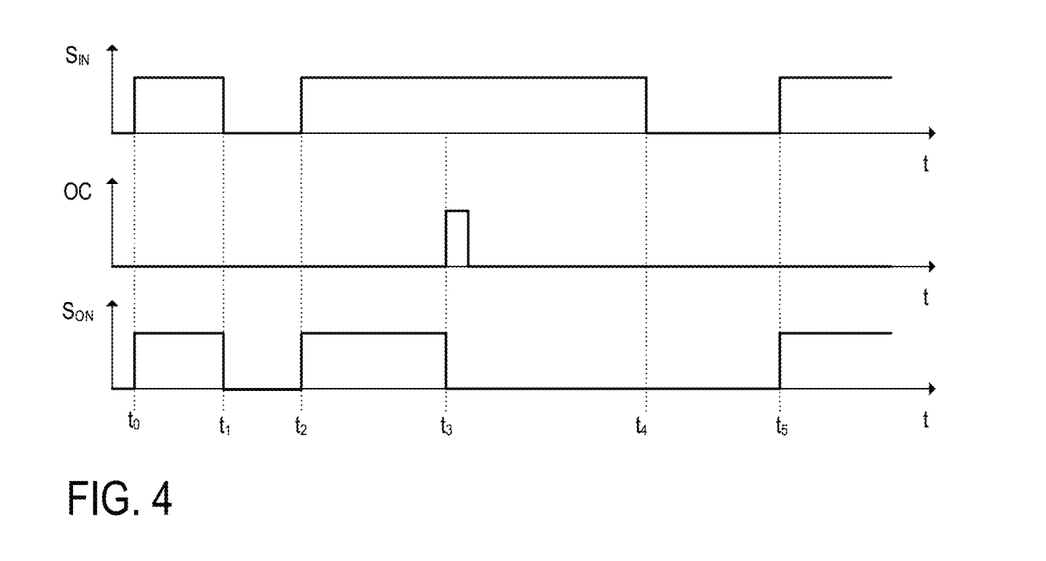
FIG. 4 includes timing diagrams illustrating the function of the control circuit shown in FIG. 2.

The function of the logic circuit 3 is further illustrated by the timing diagrams of FIG. 4. When the input signal $S_{IN}$ changes to a high level (indicating a switch-on of the electronic switch 2, see FIG. 4, time instant $t_0$ and $t_1$), the SR latch 31 is reset, which results in a high level at the inverting output Q' of the SR latch 31. Accordingly, both inputs of the AND gate 32 "see" a high level, and thus the output of the AND gate 32 provides the drive signal $S_{ON}$ with a high-level. When the input signal $S_{IN}$ changes to a low level (indicating a switch-off of the electronic switch 2, see FIG. 4, time instant $t_1$ and $t_2$), the AND gate 32 "sees" a low level at its first input, and thus the output of the AND gate 32 provides the drive signal $S_{ON}$ with a low-level. In other words, the input signal $S_{IN}$ is fed through the logic circuit 3 (i.e., the drive signal $S_{ON}$ equals the input signal $S_{IN}$) provided that the SR latch 31 is in its reset state. Once the SR latch 31 is set by the first protection signal OC changing to a high-level, the inverting output Q' of the SR latch 31 is set to a low level (see FIG. 4, time instant t). Accordingly, the AND gate 32 sees a low level at its second input and thus the drive signal $S_{ON}$ is set to a low level. In other words, the input signal $S_{IN}$ is blanked by the AND gate 32. The drive signal $S_{ON}$ remains at a low-level until the input signal $S_{IN}$ is set to a low level (indicating a switch-off of the electronic switch 2, see FIG. 4, time instant $t_4$) and again to a high level (indicating a switch-on of the electronic switch 2, see FIG. 4, time instant $t_5$), which leads to a reset of the SR latch 31. It is again noted that the function of the exemplary implementation of FIG. 3 may be implemented in various ways.

As mentioned above, the wire connecting load Z and electronic fuse circuit F may be designed to withstand a nominal current of the load Z. The lifetime of a wire (or a cable) depends on the wire temperature. FIGS. 5A and 5B are diagrams including a family of characteristic curves, wherein each characteristic curve is associated with a specific combination of maximum temperate difference dT (maximum temperature above ambient temperature) and cable cross section (e.g., cross-sectional area in mm2). Each characteristic curve represents the relation between current and the maximum allowable time period, which the wire can carry the current without exceeding the maximum temperature difference. FIG. 5A includes characteristic curves for various temperature differences dT and a specific cross sectional area of 0.35 mm², while FIG. 5B characteristic curves for a specific temperature differences dT of 25 K (Kelvin) and various cross sectional areas. As can be seen from FIGS. 5A and 5B, a wire with a cross-sectional area of 0.35 mm² may carry a current of approximately 9 A (amperes) for practically infinite time without exceeding a temperature difference dT of 25 K above ambient temperature. As can be seen from FIG. 5B, a wire with a cross-sectional area of 0.75 mm² may carry a current of 10 A (amperes) for approximately 100 seconds before exceeding a temperature difference dT of 25 K above ambient temperature. Generally, the higher the current, the shorter the allowable time period for a given cross-sectional area and a given temperature difference. It is noted that the characteristic curves shown in the diagrams of FIGS. 5A and 5B have a linearly falling branch in a double logarithmic representation.

As can be seen from FIGS. 5A and 5B, a temperature difference $dT_R$ (e.g., temperature values $dT_1$, $dT_2$, $dT_3$, $dT_4$, $dT_5$, $dT_6$) is associated with a given integration time $t_x$ (e.g., times $t_1$, $t_2$, $t_3$, $t_4$, $t_5$, $t_6$) for a given current (see FIG. 5A, current $i_x$) and a specific cross-sectional area (e.g., 0.35 mm² in the example of FIG. 5A). Hence, a temperature value dT (representing the temperature above ambient temperature)

may be determined for a specific wire cross section by integrating the current $i_L=i_x$ passing through the wire over time, and the first protection signal OC may indicate a switch-off of the electronic switch 2 when the temperature value dT reaches a defined first reference temperature difference $dT_R$. The mentioned integration may be efficiently implemented using a digital filters, which may be included in the monitoring circuit 4 (see FIG. 2). One exemplary implementation of a monitoring circuit is illustrated in FIG. 6.

Figure 5:
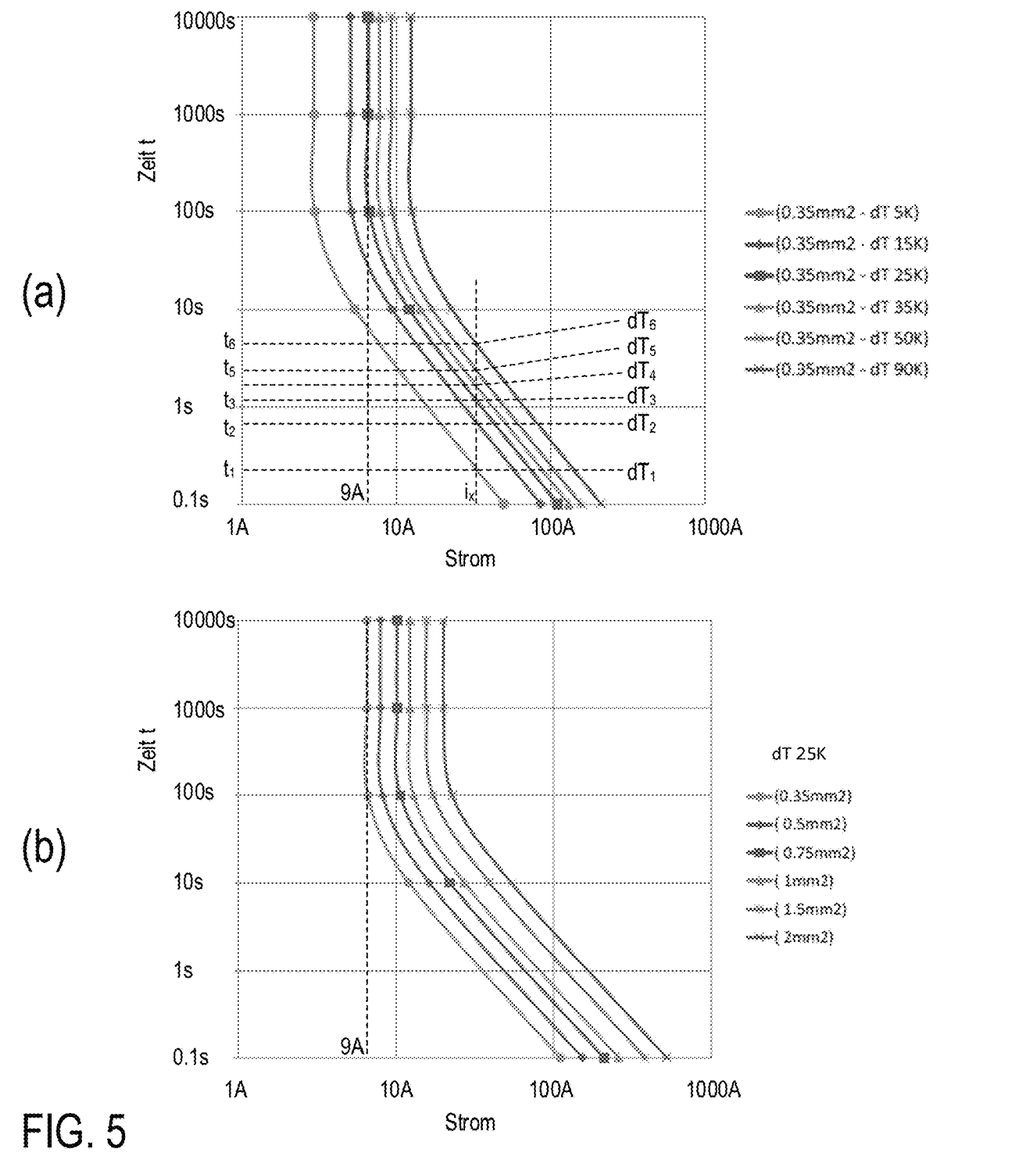
FIG. 5A is a diagram illustrating a family of characteristic curves (time over current) for a 0.35 mm2 cable and for different maximum cable temperatures.
FIG. 5B is a diagram illustrating a family of characteristic curves (time over current) for a maximum cable temperature of 25 Kelvin above ambient temperature and for different cable cross-sections.
Figure 6:
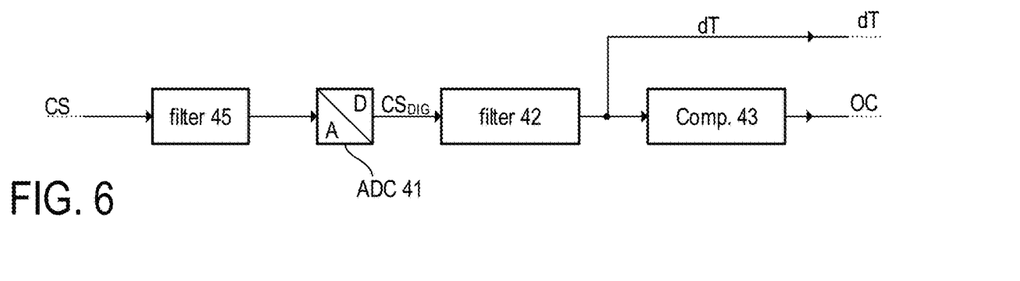
FIG. 6 illustrates one example of the monitoring circuit used in the example of FIG. 2.

Basically, the monitoring circuit of FIG. 6 is configured to determine the first protection signal OC based on the current sense signal CS. As mentioned, the integration may be accomplished in digital filter 42 which has an integrating characteristic. According to the depicted example, the current sense signal CS, which may be a voltage that is proportional to the load current $i_L$ is supplied to the input of filter 45, which may be an (optional) analog low-pass filter to remove transients or the like, which have a comparable high frequency. The output of filter 45 may be connected to the input of analog-to-digital converter (ADC) 41, which is configured to digitize the filtered current sense signal CS. The ADC 41 may have a logarithmic characteristic in order to account for the logarithmic characteristic curves shown in FIGS. 5A and 5B. The (e.g., log arithmized) digital current sense signal $CS_{DIG}$ is then converted to a temperature value dT by digital filter 42. The resulting temperature value dT (representing a temperature difference above ambient temperature) is then supplied to digital comparator 43, which may be configured to set the first protection signal OC to a high-level when the temperature value dT provided at the output of digital filter 42 exceeds the first reference temperature difference $dT_R$ (e.g., 25 K) specified for a specific wire cross-section. It is noted that, if the ADC 41 does not have a logarithmic characteristic, the digital current sense signal $CS_{DIG}$ should be squared before being supplied to the filter 42. In this regard, reference is made to FIG. 8 as well as to publication U.S. 2017/0294772A1, in which this concept of temperature calculation is described.

As mentioned, the digital filter 42 is configured to convert the load current (represent by the digitized current sense signal $CS_{DIG}$) and an associated integration time, during which the current passes through the wire, into a temperature value. In the present example, the filter characteristic 42 depends on a parameter characterizing the wire, e.g. the cross-sectional area of the wire, which carries the current and which may be represented by a family of characteristic curves such as those shown in the diagram of FIG. 5A (for an exemplary cross-sectional area of 0.35 mm²). In one specific example, the characteristic curves (or related curves) may be stored as a look-up table, i.e. by storing a plurality of sampling points of the characteristic curves in a memory. Values between two sampling points may be determined using, e.g. interpolation.

Conventional fuses are produced for a specific trigger current and with a specific trigger time (slow blow fuses, medium blow fuses, fast blow fuses), wherein the trigger time corresponds to a specific combination of reference temperature $dT_R$ and cross-section as explained above (see FIGS. 5A and 5B). It would be desirable, however, to have a configurable fuse, which may be used for various wire parameters such as, for example, wire cross-sections and maximum temperature values $dT_R$ (maximum temperature above ambient temperature).

Figure 7:
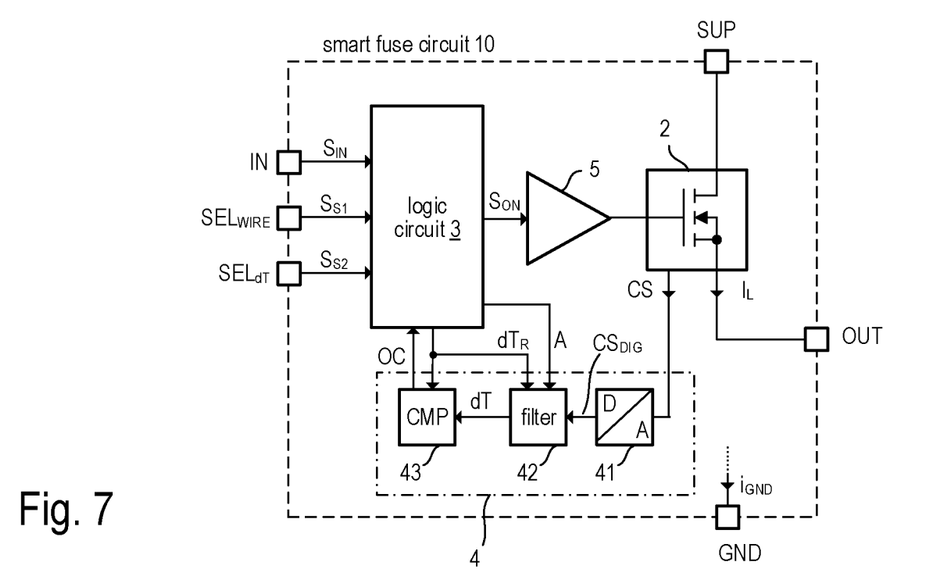
FIG. 7 illustrates a first example of an e-fuse ("smart fuse") circuit, which allows selection of wire cross section and maximum cable temperature.

FIG. 7 illustrates one example of an electronic fuse circuit, which is further referred to as smart fuse circuit 10. The circuit of FIG. 7 is substantially the same as the circuit of FIG. 2 and reference is made to the respective description. However, the logic circuit 3 is more sophisticated as in the example of FIG. 2 and the monitoring circuit 4 is implemented in accordance with FIG. 6, wherein the analog low-pass filter 45 has been omitted (the low-pass filter 45 is optional). However, different from the example in FIG. 6, the monitoring circuit 4 is configurable in the present example so that its characteristic can be selected based on at least one wire parameter, which allows, for example, to select a characteristic for a specific wire cross section and/or a desired reference temperature difference $dT_R$. In the examples described herein, the at least one wire parameter is or represents the cable cross-sectional area and/or the maximum temperature value above ambient temperate or both. As can be seen in the diagrams of FIG. 5, these two wire parameters define a specific characteristic curve, which represents the desired behavior of the electronic fuse circuit for a specific wire/cable. It is understood that other parameters such as wire diameter or absolute temperature (e.g., in case ambient temperature is measured) may be used as wire parameters. Furthermore, a wire parameter is not necessarily proportional to any physical quantity (such as cross-sectional area or temperature) but can be a mere numerical parameter, which allows determining (e.g., selecting) the desired characteristic used by the monitoring circuit. As shown in FIG. 7, the electronic fuse circuit may be an integrated circuit arranged in one chip package, wherein the electronic switch 2 and the remaining circuit components (driver 5, logic circuit 3 and monitoring circuit 4) may be integrated in the same semiconductor die or in two separate semiconductor dies disposed in the chip package. However, in other embodiments the smart fuse circuit 10 may be distributed in two or more separate chip packages. In the example of FIG. 7 all the depicted circuit components are integrated in one semiconductor chip.

The load current path of the electronic switch 2 may be connected between a supply pin SUP and an output pin OUT of the smart fuse circuit 10. Generally, the logic circuit 3 may be configured to receive at least one wire parameter, which, in the present example, includes information about a wire cross-sectional area A and a reference temperature difference $dT_R$, from a microcontroller or other control circuitry. As illustrated in FIG. 7, the logic circuit 3 may be configured to receive signals from a controller via input pin IN (input signal $S_{IN}$, see also FIG. 2) and input pins $SEL_{WIRE}$ and $SEL_{dT}$ (selection signals $S_{S1}$ and $S_{S2}$ representing a wire cross-sectional area and a temperature difference) and to provide a drive signal $S_{ON}$ for the electronic switch 2. The driver 5 may be configured to convert the signal $S_{ON}$, which is a binary logic signal, into a drive voltage or drive current suitable to switch the electronic switch 2 on and off. As in the example of FIG. 2 the monitoring circuit 4 receives an (analog) current sense signal CS and generated, based on this current sense signal CS, the first protection signal OC, which may be processed by the logic circuit 3, for example, as shown in the example of FIG. 3. It is understood that the input signal $S_{IN}$ is not necessarily received at the input pin IN. In some embodiments, the input pins IN, $SEL_{WIRE}$ and $SEL_{dT}$ may be replaced by a digital communication link (e.g., a Serial Peripheral Interface, SPI), across which digital commands and data can be received. These digital signals and commands may represent, inter alia, the input signal $S_{IN}$ and the wire parameters A and $dT_R$ and the actual input signal $S_{IN}$ may be generated within the electronic fuse circuit based on the received commands and data.

Based on the information included in the at least one wire parameter and received, e.g., from the controller, the control logic 3 may configure the digital filter 42 and/or the comparator 43 so that the characteristic of the monitoring circuit 4 corresponds to a specific combination of wire cross-sectional area A and reference temperature difference $dT_R$. In the present example, the monitoring circuit 4 can be configured based on the selection signals $S_{S1}$ and $S_{S2}$ received at the input pins input pins $SEL_{WIRE}$ and $SEL_{dT}$. Thereby, the selection signal $S_{S1}$ may represent, as a first wire parameter, a reference temperature difference $dT_R$ (which may be used as a temperature threshold in the comparator 43) and the selection signal $S_{S2}$ may represent, as a second wire parameter, a cross-sectional area A of the wire. The ground pin GND shown in FIG. 7 is coupled to a reference potential, e.g. ground potential, and connected to the logic circuit 3, and other circuit components, which need a reference potential for proper operation. It is noted that a single (analog) input pin may be sufficient to select a wire with a desired cross-section and temperature difference. Furthermore, it is understood that, in another embodiment, the first and the second wire parameter may also be coded into a single (e.g., digital) selection signal. It is understood that the specific mechanism of how the information concerning is provided to the logic circuit is not relevant. Basically, the monitor circuit is configured to be suitable for a specific wire.

Also shown in FIG. 7 is the current $i_{GND}$ drained at the ground pin GND represents the total current consumption of the smart fuse circuit itself, i.e. that portion of the current received by the smart fuse circuit and not output to the load at the output pin OUT. The level of the current $i_{GND}$ depends on the mode of operation of the smart fuse circuit which will be discussed later in more detail.

Figure 8:
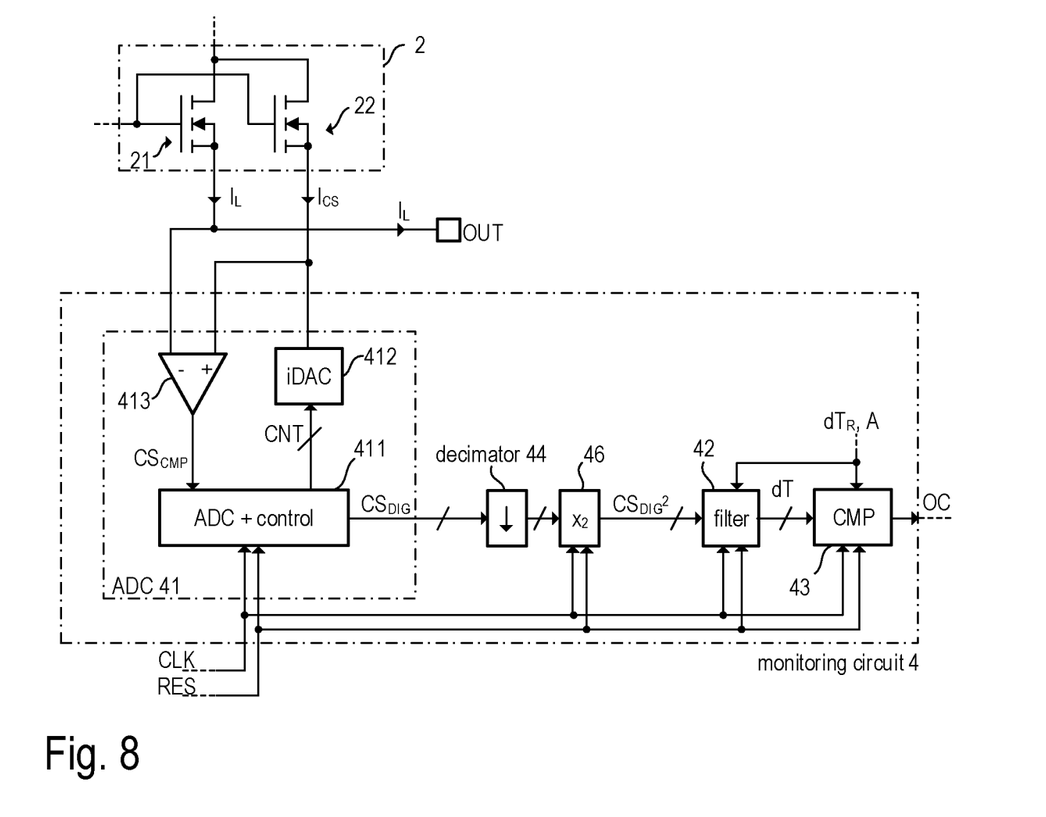
FIG. 8 illustrates one further example of the monitoring circuit used in the embodiment of FIG. 2.

FIG. 8 illustrates another exemplary embodiment of the monitoring circuit 4 in more detail. FIG. 8 also illustrates one example of how the current sensing may be implemented in more detail. For the purpose of current measurement, a so-called Sense-FET circuit is used. That is, the electronic switch actually includes two MOSFET transistors 21 and 22; transistor 21 is the actual load transistor that is coupled between a supply node (supply pin SUP) and output node (output pin OUT) and it carries the load current $i_L$, and transistor 22 is configured as sense transistor that provides a sense current $i_{CS}$ indicative of the load current. The gate electrodes of load transistors 21 and sense transistor 22 are connected and receive the same gate voltage. Similarly, the drain electrodes of load transistors 21 and sense transistor 22 are connected and receive the same drain voltage (supply voltage $V_B$ in case of a high-side configuration). The source current of the sense transistor is referred to as sense current $i_{CS}$, which is substantially proportional to the load current $i_L$ (source current of load transistor 21) when the drain-source-voltages of both transistors 21, 22 are equal. In this case, the two transistors are operated in the same operating point and the ratio of the source currents $i_L/i_{CS}$ equals the ratio $A_{21}/A_{22}$ of the active areas of transistor 21 and transistor 22.

The monitor circuit 4 of FIG. 8 receives the current sense signal, which is the sense current $i_{CS}$ is the present example, and generates a respective digital current sense signal $CS_{DIG}$. The analog-to-digital converter (ADC) 41 may be a counter type ADC or a SAR (Successive Approximation Register) type ADC. Accordingly, the ADC 41 includes a control circuit 411, a current-output digital-to-analog converter (DAC) 412 and a comparator 413. The control circuit 411 is configured to modify a digital register CNT in accordance with a given scheme and the resulting analog current sunk from the source terminal of the sense transistor 22. That is, the output node of the current-output DAC is connected to the source electrode of the sense transistor 22 and, thus, the source current of the sense transistor is practically set by the DAC 412. The comparator 413 is configured to compare the source potentials of load transistor 21 and sense transistor 22 and indicates (by a level change at its output) when the source potentials are equal. As mentioned, in this situation the sense current $i_{CS}$ is proportional to the load current $i_L$ and, thus, the value of register CNT represents the load current and is output as digital current sense signal $CS_{DIG}$. In a simple implementation, the control circuit 411 may basically include a counter that is regularly reset and counts up (thereby ramping up the DAC output current) until the comparator 413 indicates that the source potentials of transistors 21, 22 are equal. As mentioned, more sophisticated schemes (such as SAR) may be used to modify the register CNT.

Dependent on the implementation the monitoring circuit 4 may include a decimator 44 (which is thus optional) to reduce the data rate of the digital data stream provided by the ADC 41. The monitoring circuit 4 may further include the squaring unit 45 configured to calculate the square of the digital current sense signal $CS_{DIG}$. The squaring unit 45 is optional and can be omitted when the ADC 41 has a logarithmic characteristic as already mentioned above. In the example depicted in FIG. 8, the ADC 41 has a linear characteristic and the squared current sense signal $CS_{DIG2}$ s filtered using a digital filter 42. The filter 42 may include an integrating characteristics as already discussed above and the filter output signal represents the cable temperature and indicates a temperature difference dT of the cable above ambient temperature. Digital comparator 43 is used to compare the temperature difference dT with a threshold and indicate an overcurrent (signal OC) when a reference temperature difference $dT_R$ is exceeded. It is noted that the digital circuitry included in monitor circuit 4 operates using a clock signal CLK and needs to be initialized to a specific initial state, which is usually done by a reset signal $R_{ES}$.

It is understood that the electronic fuse circuit as such, and particularly the (clocked) sequential logic included in the monitoring circuit 4, may have a significant current consumption even, if the load current $i_L$ provided at the output node OUT is low. Particularly, the current consumption may be too high for the electronic fuse circuit being operated at terminal no. 30 (according to DIN 72552, direct connection to positive pole of battery) of an on-board power supply of a car.

According to the embodiments described herein, the control circuit 1 (see FIG. 1) is configured to switch between a normal mode and an idle mode, wherein, during idle mode operation, the current consumption of the control circuit 1 is significantly reduced as compared to normal mode operation. In this context (and somewhat unusual for an idle mode), it is noted that the electronic switch 2 must be kept in an on-state all the time (i.e., even in idle mode), because the electronic switch 2 should basically behave like a fuse, which disconnects the load from the supply node only when the load current is high enough for a specific time (see diagrams of FIG. 5).

In the embodiments described herein the control circuit 1 operates in idle mode when the load current $i_L$ provided at the output node OUT is low, e.g. below a threshold current $i_{IDLE}$ (idle mode condition: $i_L<i_{IDLE}$). Further, the control circuit 1 may be configured to enter idle mode if, and only if, one or more of the following additional conditions are fulfilled: the monitor circuit 4 does not signal an over-temperature (i.e., calculated temperature dT is lower than a threshold temperature $dT_x$), the electronic switch 2 is in an on-state (i.e., signal $S_{ON}$ is high), and the junction temperature $T_J$ of the transistor, which forms the electronic switch 2, is below a given temperature threshold $T_{MAX}$ (e.g., $T_{MAX}=140°$ C.).

Figure 9:
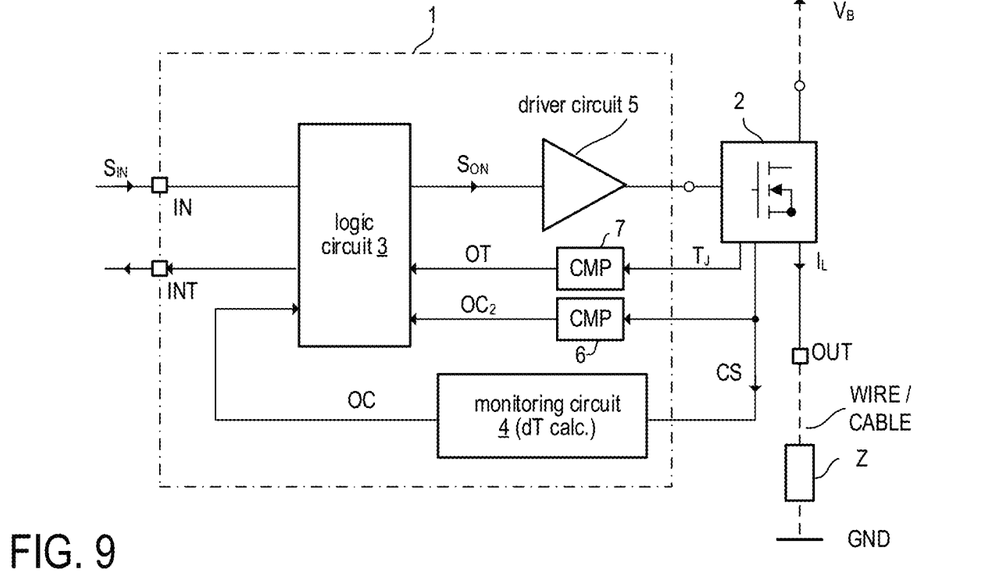
FIG. 9 illustrates a second example of an e-fuse circuit similar to the example of FIG. 7 but with an additional over-temperature and an additional over-current shutdown function.

In idle mode, at least the following functions have to be available and provided by the control circuit 1: current comparator for evaluating the idle mode condition $i_L<i_{IDLE}$ (i.e., for detection when the load current rises above the threshold current); overcurrent switch-off (optional); and over-temperature switch-off (optional). Particularly the monitor circuit 4, which implements the calculation of the temperature difference (over ambient temperature) of the wire connected to the electronic fuse device, may be inactive in idle mode in order to reduce power consumption. The example of FIG. 9 illustrates an electronic fuse circuit which is basically the same like the circuit of FIG. 2. However, the circuit of FIG. 9 additionally includes a comparator 6 configured to evaluate the idle mode condition $i_L<i_{IDLE}$ (and thus to detect a violation of this condition) and a further comparator 7 configured to evaluate the supplemental condition $T_J<T_{MAX}$. The above-mentioned supplemental condition that the electronic switch 2 is in an on-state may also be checked by monitoring the gate voltage $V_G$ of the transistor 2 by a further comparator (not shown in FIG. 9). In one specific embodiment, the electronic fuse circuit includes a digital output node (chip pin INT) coupled to the logic circuit 3, which is configured to signal, at the digital output node INT, when the stat machine changes from idle mode back to normal mode. An external control circuit, for example, a microcontroller, may receive the signal provided at the digital output node INT and use this signal as interrupt signal.

Figure 10:
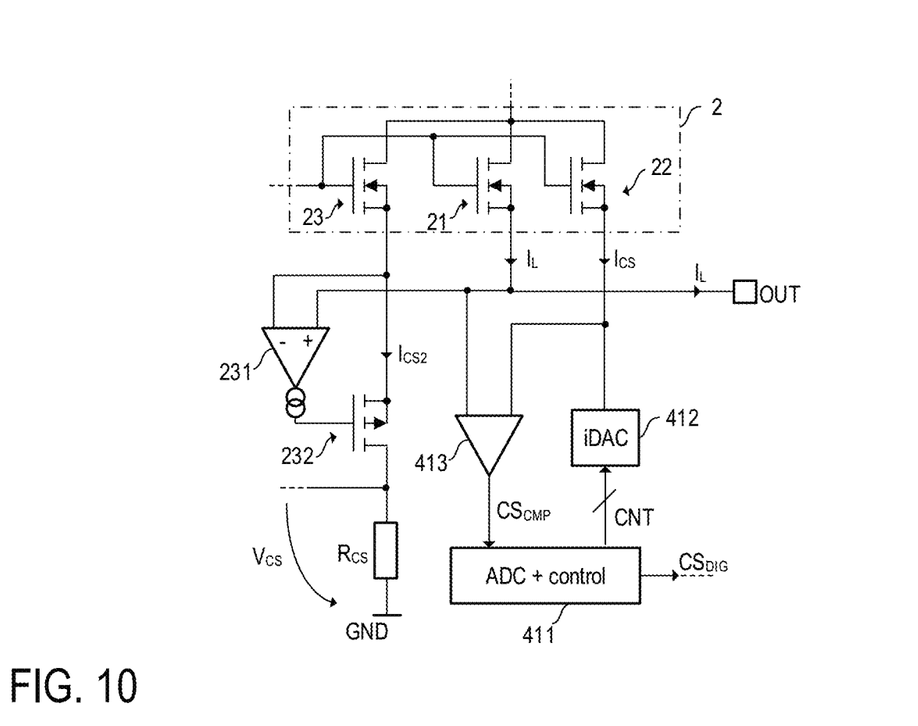
FIG. 10 illustrates one example of a current sense circuit which may be used in connection with the examples of FIGS. 7 and 9.

FIG. 10 illustrates one exemplary implementation of the current sense function. Basically, the current sense circuit shown in FIG. 10 is an enhancement of the current sense circuit included in FIG. 8, which has already been discussed further above. In the example of FIG. 10, a Sense-FET circuit is used, wherein the electronic switch 2 includes three MOSFET transistors 21, 22, and 23. Transistor 21 is the actual load transistor that is coupled between a supply node (supply pin SUP) and output node (output pin OUT) and it carries the load current $i_L$ (like in the example of FIG. 8); transistors 22 and 23 both are configured as sense transistors that provide a sense current $i_{CS}$ and, respectively, $i_{CS2}$ which are indicative of the load current. The gate electrodes of load transistors 21 and the sense transistors 22 and 23 are connected and receive the same gate voltage $V_G$. Similarly, the drain electrodes of load transistors 21 and the sense transistors 22 and 23 are connected and receive the same drain voltage (supply voltage $V_B$ in case of a high-side configuration). The source current of the sense transistor 22 is referred to as sense current $i_{CS}$, and the source current of the sense transistor 23 is referred to as sense current $i_{CS2}$, both of which are substantially proportional to the load current $i_L$ (source current of load transistor 21) when the drain-source-voltages of the transistors 21, 22, and 23 are equal.

The part on the right side of FIG. 10 (current output DAC 412, control circuit 411, and comparator 413) is the same as in the example of FIG. 8 and reference is to the respective description above. The control circuit 411 can operate as analog-to digital converter and generates a digital current sense signal $CS_{DIG}$, which is used, for example, by for calculating the temperature difference dT in the monitoring circuit. The part on the left side of FIG. 10 (further transistor 232, resistor $R_{CS}$ and amplifier 231) are configured to perform a redundant current measurement. In the present example, the transistor 232 is a p-channel MOS transistor whose source electrode is connected to the source electrode of sense transistor 23, so that the source current iCS2 of sense transistor 23 is also the source current of the further transistor 232. The first and second inputs of the amplifier 231 are connected to the source electrode of the load transistor 21 and the sense transistor 23, and the output of the amplifier 231 is connected to the gate electrode of the transistor 232. The amplifier 232 may be implemented as operational transconductance amplifier (OTA) which drives the transistor 232 such that the difference between the source potentials of the load transistor 21 and sense transistor 23 approaches zero. As mentioned, in such a situation, the sense current $i_{CS2}$ is proportional to the load current $i_L$ as the two transistors 21, 23 operate in the same operating point. The sense current $i_{CS2}$ passes the resistor $R_{CS}$ which is connected in series to the drain-source path of transistor 232. In the depicted example, the resistor $R_{CS}$ is connected between the drain electrode of transistor 232 and ground potential. The voltage drop $V_{CS}$ across the resistor $R_{CS}$ ($V_{CS}=R_{CS} \cdot i_{CS2}$) can be used as analog current sense signal and supplied to comparator 6 shown in FIG. 9. The comparator may be configured to compare the analog current sense signal $V_{CS}$ with a reference voltage $V_{REF}=R_{CS} \cdot i_{IDLE}/k_{ILS}$. In this example $k_{ILIS}$ is the factor of proportionality between the load current $i_L$ and the sense current $i_{CS2}$ ($i_{CS2}=i_L/k_{ILIS}$) and the condition $V_{CS}<V_{REF}$ is equivalent with the idle mode condition $i_L<i_{IDLE}$ discussed above.

A temperature sensor for measuring the junction temperature of the electronic switch 2 is not explicitly shown in FIG. 9. It is noted, however, that many ways of implementing a temperature sensor close to a transistor of even embedded within the transistor cell field, which composes a power MOS transistor, are well known in the field and thus not further discussed here. In practice, a pn-junction may be used as temperature sensing element.

The circuitry which controls a changeover from normal mode to idle mode (and vice versa) may be included in the logic circuit 3 shown in FIG. 9. For example, the logic circuit 3 may include a finite state machine (FSM, also referred to as finite automaton) which can be described by the state diagram illustrated in FIG. 11. Accordingly, in the normal state (for e-fuse operation) the input signal $S_{IN}$ is at a high level indicating that the electronic switch 2 is to be switched on, and thus the logic circuit generates a respective control signal $S_{ON}$ for the gate driver 5 (unless any protection mechanism prevents it), and the gate driver 5 generates a sufficiently high gate voltage $V_G$ to switch on the electronic switch 2 (cf. FIG. 9). In case of a high-side switch the output pin OUT is close to supply voltage $V_B$. The monitoring circuit 4 is active and thus the current consumption $i_{GND}$ of the control circuit 1 may be comparably high, e.g. 20 mA.

Figure 11:
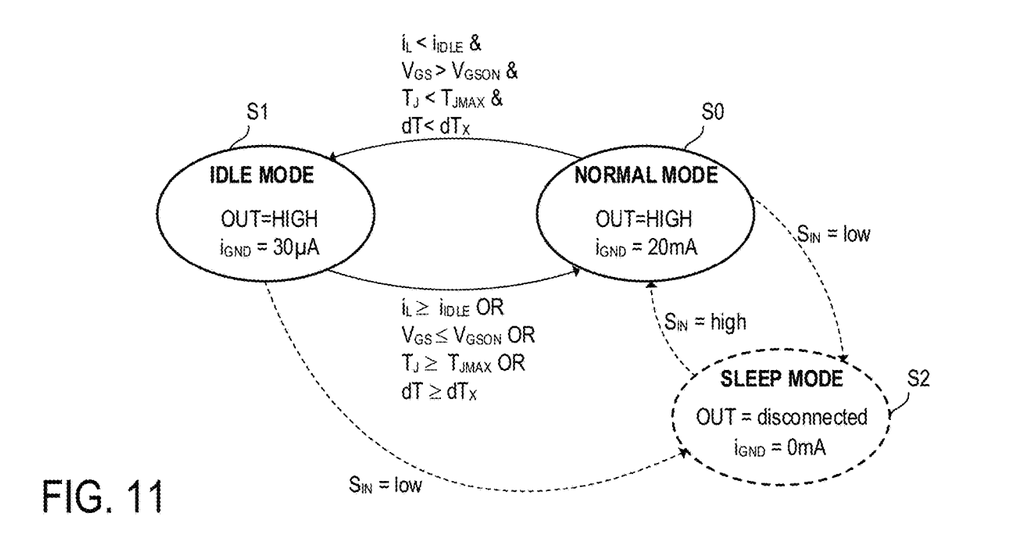
FIG. 11 shows a state diagram illustrating one example of a finite state machine, which may be implemented in the logic circuits used in the examples of FIGS. 7 and 9, wherein the state machine allows the electronic fuse circuit to operate in an idle mode under certain conditions.

In the example depicted in FIG. 11, the state machine changes from normal mode (state S0) into idle mode (state S1) when the following conditions are cumulatively fulfilled: (i) load current $i_L$ provided at output pin OUT is lower than a threshold current $i_{IDLE}$ ($i_L<i_{IDLE}$); the electronic switch 2 is on; (iii) the junction temperature $T_J$ of the electronic switch 2 is lower than a maximum value $T_{JMAX}$ ($T_J<T_{JMAX}$); and (iv) the estimated cable difference temperature dT (above ambient temperature) is lower than a threshold value $dT_X$. The state machine switches back from idle mode to normal mode when at least one of these conditions (i) to (iv) is violated. Optionally, a switch-over from normal mode to idle mode is only triggered when (condition (v)) normal mode has been active for a given minimum time $t_{MIN}$. This further condition may help to avoid undesired toggling. The condition (ii) may be checked, e.g. by using a comparator which indicates when the gate-source voltage $V_{GS}$ supplied to the electronic switch 2 falls below a threshold voltage $V_{GSON}$ ($V_{GS}<V_{GSON}$). Alternatively, the logic state of signal $S_{ON}$ may be checked to determine whether the electronic switch 2 is on. In the idle mode (state S1), the monitoring circuit 4 (see, e.g. FIG. 9) and further circuitry may be inactive so that the current consumption $i_{GND}$ of the control circuit 1 is comparably low, e.g. 30 µA. The reduction of current $i_{GND}$ consumed by the smart fuse circuit itself (i.e., consumed by the control circuit 1 and not output to the load) is mainly achieved by deactivating most of the clocked digital circuitry, particularly the monitoring circuit 4.

It is understood, that the state machine may have more than the two states "normal mode" (state S0) and "idle mode" (state S1). For example, a "sleep mode" (state S2) is illustrated in FIG. 1i. In this example, the state machine changes to sleep mode when the input signal $S_{IN}$ changes to a low level indicating a switch-off of the electronic switch 2. Accordingly, the output pin OUT is disconnected in sleep mode from the supply pin by switching off the electronic switch 2. The monitoring circuit 4 may also be inactive in sleep mode to save energy. However, the sleep mode (state S2) is not to be confused with idle mode. As mentioned, the electronic switch 2 is in an on-state during idle mode operation (state S1) and thus the load connected to the output pin OUT via a cable is supplied with supply voltage $V_B$ present at supply pin SUP (see, e.g., FIG. 7). In contrast, the electronic switch 2 is in an off-state during sleep mode operation.

It is understood, that the expressions "sleep mode", "idle mode" and "normal mode" are merely names used to distinguish the specific modes and functions of the smart fuse circuit associated with the respective modes. These names do not imply any features and functions beyond what is described herein and could also be replaced by, for example, "first mode", "second mode", and "third mode".

Figure 12:
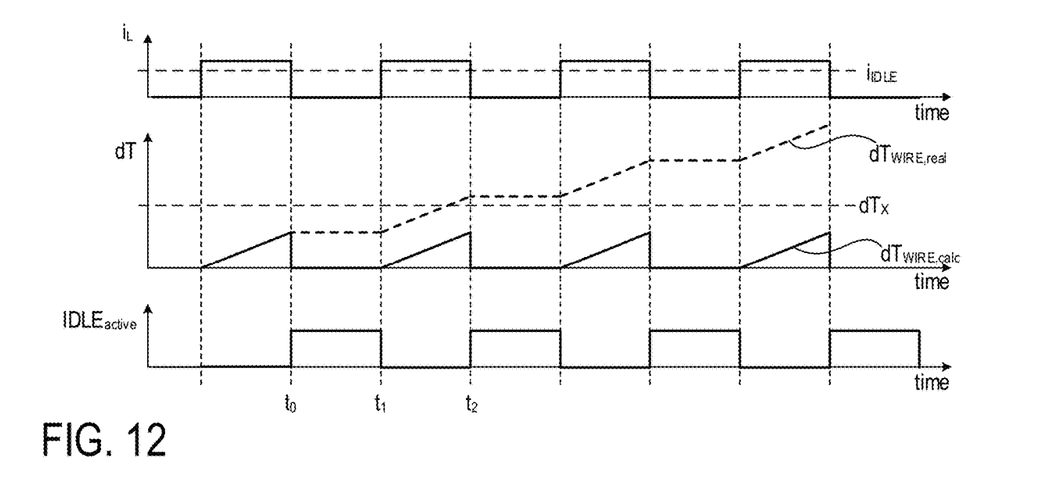
FIGS. 12-14 show timing diagrams illustrating examples of how the electronic fuse circuit behaves during pulse-width operation of a connected load.

The timing diagrams of FIG. 12 illustrate one problem that may occur when the load connected to the output pin OUT draws a load current $i_L$ which is modulated (e.g., a pulse-width modulated). The first (top) timing diagram of FIG. 12 illustrates one exemplary waveform of a pulse-width modulated load current which has, in the present example, a duty cycle of 50 percent. Accordingly, the load current $i_L$ drops to zero at time instant $t_0$, rises again to its nominal value at time instant $t_1$, drops again to zero at time instant $t_2$, etc. As soon as the load current $i_L$ drops to zero ($i_L<i_{IDLE}$, condition (i), the smart fuse circuit will enter idle mode at time instant $t_0$ as the other conditions (ii) to (iv) will be usually (under normal circumstances) fulfilled when the load is switched on. However, as the load current $i_L$ again rises above the threshold value $i_{IDLE}$ to its nominal value at time instant $t_1$ ($i_L>i_{IDLE}$), the idle mode will only be active for a short time period $t_1-t_0$ in each cycle of the pulse width modulation (see third (bottom) diagram of FIG. 12).

The short time period $t_1-t_0$ may be significantly less than 100 µs for an exemplary modulation frequency of 10 kHz, which is significantly shorter than the typical thermal time constant of a cable (which may be in more than 60 seconds). This means that the actual difference temperature $dT_{WIRE,real}$ of the cable will practically not change during the short time period $t_1-t_0$ (see second timing diagram of FIG. 12). However, as the monitor circuit 4, which calculates the estimated temperature $dT_{WIRE,calc}$ of the cable, is deactivated in idle mode, the current temperature estimation $dT_{WIRE,calc}$ gets lost at time instant $t_0$ when the circuit enters idle mode because the state of the filter 42 (see FIG. 8) is reset to an initial value. As a consequence the calculation of the estimated temperature is resumed at time instant $t_1$ with the wrong initial value and the estimated temperature $dT_{WIRE,calc}$ does not track the real temperature $dT_{WIRE,real}$ of the cable. As can be seen in the second timing diagram of FIG. 12 the regular reset of the filter state of filter 42 of the monitor circuit prevents a current temperature estimation, and an excess temperature of the wire cannot be detected anymore.

Figure 13:
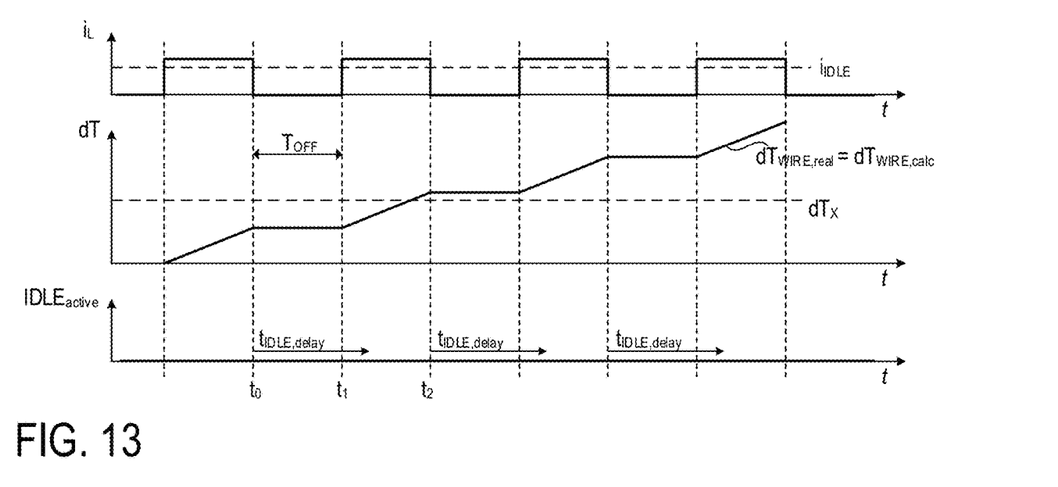

The problem discussed above may be avoided by delaying the changeover to idle mode for a given delay time $t_{IDLE,delay}$. That is, idle mode will not be entered immediately at the time instant, at which the idle mode conditions (i) to (iv) are detected, but rather only when the idle mode conditions (i) to (iv) are fulfilled throughout the delay time $t_{IDLE,delay}$. When the delay time $t_{IDLE,delay}$ is chosen to be longer than the maximum off-time $T_{OFF}$ of the load current $i_L$ during pulse width modulation (PWM), then the smart fuse circuit will not enter idle mode during PWM operation of the load thus allowing the monitor circuit 4 to track the actual cable temperature $dT_{REAL}$. This approach is illustrated by the timing diagrams of FIG. 13, which basically correspond to the timing diagrams of FIG. 12 with the only difference that idle mode does not become active due to the mentioned delay. In other words, the above-mentioned four conditions (i) to (iv), which have to be fulfilled to enter the idle mode, are supplemented with the further condition that conditions (i) to (iv) are maintained throughout the delay time $t_{IDLE,delay}$ before idle mode is entered.

Figure 14:
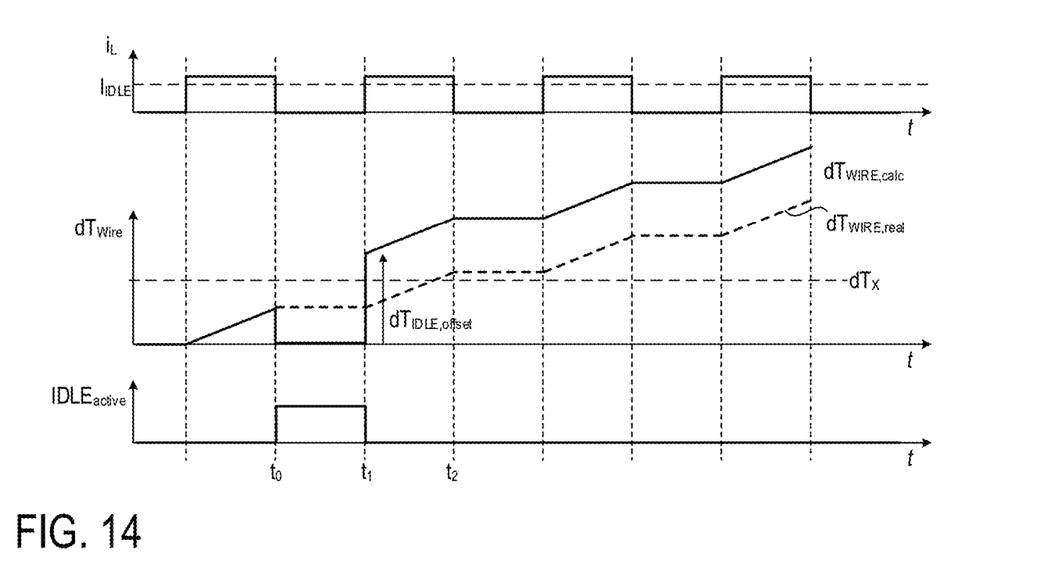

The timing diagram in FIG. 14 illustrates another approach, which may be used alternatively to the delay time $t_{IDLE,delay}$. The first timing diagram of FIG. 14 is the same as in FIGS. 12 and 13. However, as can be seen in the second timing diagram of FIG. 14, a temperature offset $dT_{IDLE,offset}$ is added t the initial temperature value when leaving the idle mode at time instant $t_1$ due to the load current $i_L$ exceeding the threshold value $i_{IDLE}$. The temperature offset $dT_{IDLE,offset}$ may be constant and configurable (like the delay $t_{IDLE,delay}$ in the previous example), wherein $dT_{IDLE,offset}>dT_X$. As can be seen in FIG. 14 adding the temperature offset $dT_{IDLE,offset}$ has the effect that temperature estimation starts with an initial value higher than the threshold value $dT_X$ when leaving idle mode at time instant $t_1$. As a consequence, the estimated temperature difference $dT_{WIRE,calc}$ may be higher than the actual temperature difference $dT_{WIRE,real}$ (over ambient temperature). The slight mismatch between $dT_{WIRE,calc}$ and $dT_{WIRE,real}$ caused by the temperature offset $dT_{IDLE,offset}$ will be maintained until the protection threshold $dT_R$ is reached. Due to the temperature offset the monitoring circuit 4 will trigger a switch-off (protection signal OC) slightly earlier as compared with the previous approach which does not use the temperature offset $dT_{IDLE,offset}$ (cf. also FIG. 8) which is safer than not reliably tracking the temperature as illustrated in FIG. 12. As can be seen from FIG. 14, adding the temperature offset $dT_{IDLE,offset}$ helps to avoid that idle mode is entered in each PWM cycle because—due to the temperature offset—the above-mentioned condition (iv), namely $dT<dT_X$, will not be fulfilled until the load current is switched off (or assumes very low values) for a significant time (e.g., one or more minutes). The two approaches (delay time $t_{IDLE,delay}$ and temperature offset $dT_{IDLE,offset}$) may be combined in one embodiment.

Although the invention has been illustrated and described with respect to one or more implementations, alterations and/or modifications may be made to the illustrated examples without departing from the spirit and scope of the appended claims. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

What is claimed is:

1. An circuit comprising:
an electronic switch having a load current path coupled between an output node and a supply node and configured to connect or disconnect the output node and the supply node in accordance with a drive signal;
a control circuit configured to generate the drive signal based on an input signal;
a monitoring circuit included in the control circuit and configured to receive a current sense signal representing the load current passing through the load current path and to determine a first protection signal based on the current sense signal and at least one wire parameter that characterizes a wire operably connected to the output node, the first protection signal being indicative of whether to disconnect the output node from supply node; and
wherein the control circuit is configured to operate in a normal mode and at least in an idle mode;
wherein the control circuit is configured to change from normal mode to idle mode, when at least the following idle mode conditions are fulfilled: the load current is below a given current threshold and the electronic switch is switched on; and the determined temperature value indicative of a wire temperature difference is lower than a given threshold value, and
wherein, in idle mode, the monitoring circuit is inactive,
wherein the monitoring circuit is configured to determine a temperature value indicative of a wire temperature difference above ambient temperature,
wherein the control circuit is configured to leave idle mode and change back to normal mode when at least one idle mode condition is violated, and
wherein a temperature offset is added to the temperature value when leaving idle mode.

2. The circuit of claim 1,
wherein the electronic switch is implemented as field-effect transistor, and
wherein the circuit further comprises a temperature sensor, which is configured to provide a temperature signal indicative of a junction temperature of the field-effect transistor.

3. The circuit of claim 1,
wherein the idle mode conditions further include at least one of the following: a temperature of the electronic switch is below a given temperature threshold; the electronic switch is in an on-state; and the control circuit has been operating in normal mode for a given minimum time.

4. The circuit of claim 1,
wherein the control circuit is configured to change from normal mode to idle mode, when the idle mode conditions are fulfilled throughout a delay time period.

5. The circuit of claim 1, further comprising:
a current sense circuit included in or coupled to the electronic switch, the current sense circuit being configured to generate the current sense signal and a further current sense signal.

6. The circuit of claim 5,
wherein the current sense circuit includes a digital part configured to generate the current sense signal and an analog part configured to generate the further current sense signal, the digital part being inactive in idle mode.

7. The circuit of any of claim 1,
wherein the control circuit is further configured to change to a sleep mode, when the input signal indicates to switch the electronic switch off.

8. The circuit of any of claim 1, further comprising:
a digital output node configured to output a signal generated by the control circuit, when a control mode of the control circuit changes from idle mode into normal mode.

9. The circuit of claim 1,
wherein, in idle mode, all clocked digital circuitry included in the control circuit is deactivated.

10. The circuit of claim 1,
wherein the control circuit is configured to terminate idle mode when at least one of the idle mode conditions are violated.

11. A method comprising:
establishing a load current path between an output node and a supply node by activating an electronic switch in accordance with a drive signal generated by a control circuit that is configured to operate in a normal mode and at least in an idle mode;
determining, by a monitoring circuit included in the control circuit and when the control circuit operates in normal mode, a first protection signal based on a current sense signal, which represents a load current passing through the load current path, and at least one wire parameter that characterizes a wire operably connected to the output node, the first protection signal being indicative of whether to disconnect the output node from supply node;
changing from normal mode to idle mode, when at least the following idle mode conditions are fulfilled: the load current is below a given current threshold and the electronic switch is switched on; and the determined temperature value indicative of a wire temperature difference is lower than a given threshold value;
determining a temperature value indicative of a wire temperature difference above ambient temperature;
leaving idle mode and changing back to normal mode when at least one idle mode condition is violated; and
adding a temperature offset to the temperature value when leaving idle mode.

12. The method of claim 11,
wherein the control circuit generates the drive signal based on an input signal and the method further includes changing to a sleep mode, when the input signal indicates to switch the electronic switch off.

13. The method of claim 11, wherein changing from normal mode to idle mode includes:
changing from normal mode to idle mode, when the idle mode conditions are fulfilled throughout a delay time period.

* * * * *